United States Patent [19]

Anderson

[11] Patent Number: 4,566,082
[45] Date of Patent: Jan. 21, 1986

[54] MEMORY PACK ADDRESSING SYSTEM
[75] Inventor: Russell Y. Anderson, Hillsboro, Oreg.
[73] Assignee: Tektronix, Inc., Beaverton, Oreg.
[21] Appl. No.: 478,181
[22] Filed: Mar. 23, 1983
[51] Int. Cl.[4] .............................................. G11C 8/00
[52] U.S. Cl. ................................................... 365/230
[58] Field of Search ........................ 365/189, 230, 231
[56] References Cited

U.S. PATENT DOCUMENTS 4,156,290   5/1979   Lanza .................................. 365/230

Primary Examiner—Joseph A. Popek
Attorney, Agent, or Firm—George T. Noe

[57] ABSTRACT

Disclosed herein is a system for addressing a memory pack having a plurality of memory chips such as RAMs or ROMs. Each memory chip receives address signals and a chip enable signal. A chip selector generates the chip enable signal in response to a feedback signal from the memory pack provided in response to the memory address lines. Since each memory pack excludes the chip selector circuitry, the memory packs can be made smaller in size. The memory packs are in effect self-configuring since they control the feedback of the address signals to the chip selector which generates the chip enable signals. Many types and capacities of memory packs can be mixed in the system since the pack determines the memory address space in which it resides.

3 Claims, 4 Drawing Figures

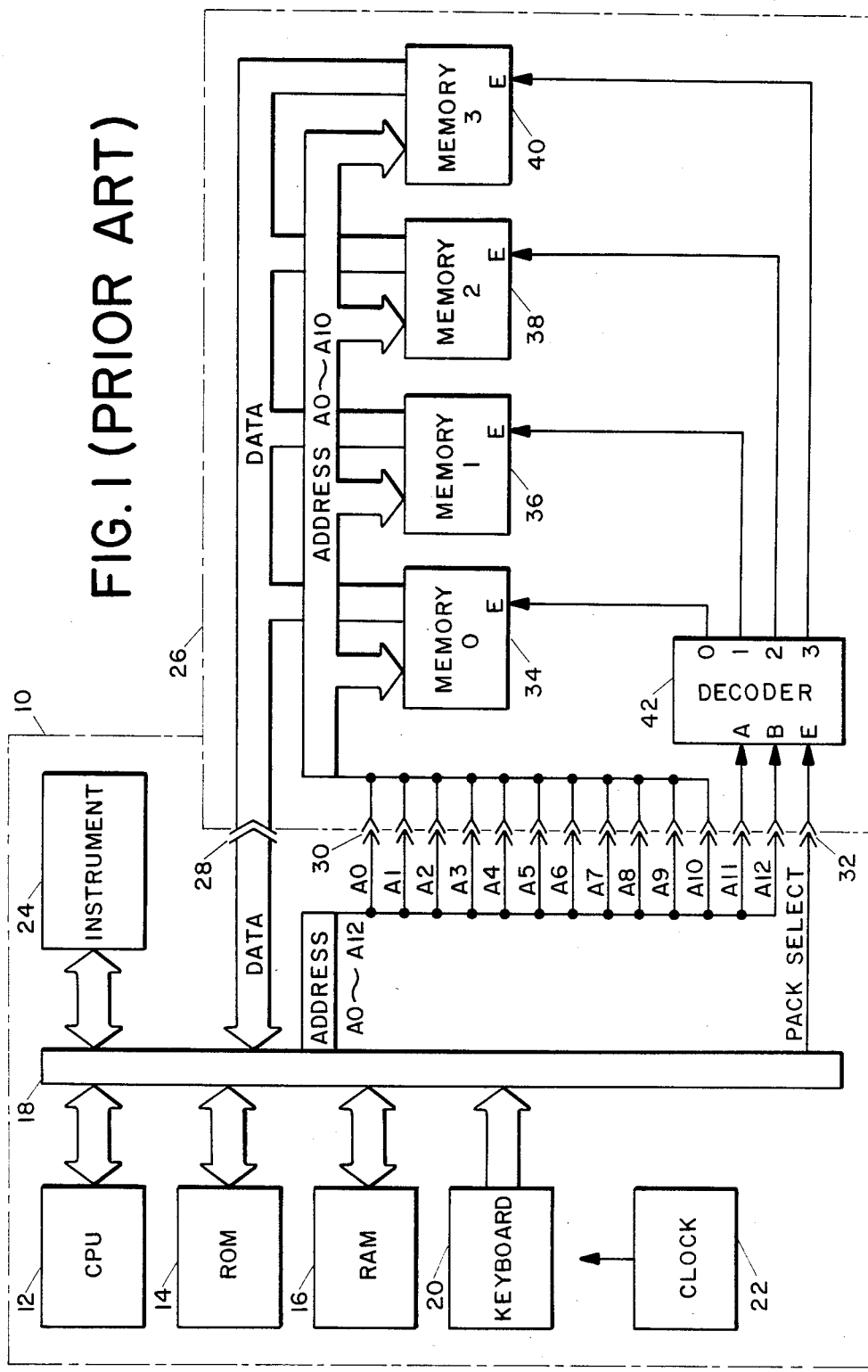
FIG. I (PRIOR ART)

MEMORY PACK ADDRESSING SYSTEM

BACKGROUND OF THE INVENTION

The present invention relates to a system for addressing memory packs within a microprocessor system.

Microprocessor systems are widely used in many kinds of electronic apparatus such as personal computers, electronic measurement instruments, etc. A microprocessor system usually includes a microprocessor as a central processing unit (CPU), a read only memory (ROM) for storing microprograms and a random access memory (RAM) for temporary memory storage. The CPU processes data (or sometimes executes programs in the RAM) in accordance with the microprograms stored in the ROM. Sometimes, it is desirable to change the microcode in the ROM, to reconfigure, or to expand the memory capacity of the RAM for changing or improving the function of the microprocessor system. For this end, a memory pack system to configure memory space is useful. The memory pack may include a ROM storing another operating system microprogram instead of the ROM originally in the microprocessor system, or the pack may simply include a RAM for increasing the memory storage capacity.

FIG. 1 illustrates a conventional apparatus employing a microprocessor system which can accept a memory pack. As described hereinbefore, microprocessor system (processor) 10 includes CPU 12, ROM 14 and RAM 16 which are connected to main bus 18 which includes the appropriate data, address and control lines consistent with the specific CPU chosen. CPU 12 may be an eight-bit microprocessor such as the 8080, the Z-80A or the like, in which case the address bus would consist of sixteen lines. In addition, processor 10 further includes keyboard 20 as an input device connected to bus 18, and clock generator 22 for applying a clock signal to each system component. Instrument 24, which could be any piece of electronic instrumentation, e.g. a logic state analyzer, may be connected to bus 18 for control by CPU 12. Processor 10 can accept memory pack 26 and further to that purpose processor 10 has data connector 28, address connector 30 for address lines A0 through A12, and control connector 32, wherein these connectors 28, 30, and 32 are connected to bus 18. In this instance, the memory capacity of memory pack 26 must be less than 8K bit (8K-byte), since address connector 30 has thirteen contacts.

Memory pack 26 includes four 2K-bit (or 2K-byte) memory chips 34 through 40 and decoder 42. The memory chips may be RAM or ROM integrated circuits (ICs). The output signals from memory chips 34 through 40 are coupled to data connector 28, and the address signals are connected to lines A0 through A10 of address connector 30. Lines A11 and A12 are connected to input terminals A and B of decoder 42 and the outputs (0, 1, 2, 3) thereof are connected to the enable terminals E of memory chips 34 through 40. Decoder 42 is enabled in accordance with a pack select signal applied from bus 18 via control connector 32 to the enable terminal E. Decoder 42 acts as a selector for selecting one of memory chips 34 through 40. If the memory chips are RAMS, a read/write control line is also needed.

This conventional apparatus can change the ROMs or increase the RAMS, however, memory pack 26 is cumbersome in size because it includes many IC chips. If the memory pack size is large, it is not only burdensome to carry the additional memory packs but the system must provide a correspondingly large space to accept the memory packs.

SUMMARY OF THE INVENTION

In accordance with the preferred embodiment of the present invention, a memory pack addressing system is provided in which the number of components in the memory pack can be decreased and the memory pack can thus be made more compact. Also, the specific area of memory the pack shall fill, i.e., the memory addresses it will respond to, is determined by the pack. A processor includes a decoder (memory chip selector) for selecting memory chips in the memory packs. Input selection signals of the decoder are supplied from some of the address lines in the memory packs through connectors coupling the pack to the processor. In other words, the address lines are connected from a main bus in the processor via address connectors to address lines in the memory pack. Some of these address lines are then used to provide a feedback signal to a decoder in the processor. The outputs from the decoder are then applied via connectors coupling the processor to the system bus and the memory pack to the chip enable terminals of the memory chips in the memory pack. Since a relationship between the address lines and the inputs of the decoder is determined by a configuring signal path in the memory pack, many different sizes and types of memory packs can be mixed in a processor.

It is, therefore, one advantage of the present invention that it provides an improved system for addressing a memory pack coupled to the processor of a microprocessor system. It is another advantage of the present invention to provide a memory pack addressing system which provides a memory chip selector in a processor memory addressing system wherein the chip select signal is derived from predetermined address lines from the processor which is fed back through a signal path in the memory pack to be selected to the memory chip selector. It is an additional advantage of the preferred embodiment of the present invention that it provides a memory pack addressing system which allows a decrease in the number of components in each memory pack. It is a further advantage that the memory pack addressing system allows the mixing of many different types and sizes of memories within a memory pack.

Other advantages of the present invention will become apparent upon a reading of the following description when taken in conjunction with the accompanying drawings.

BRIEF DESCRIPTION OF THE DRAWINGS

FIG. 1 shows a block diagram of a conventional apparatus including a microprocessor system being able to accept a memory pack.

DESCRIPTION OF THE EMBODIMENTS OF THE INVENTION

Figure 2A:
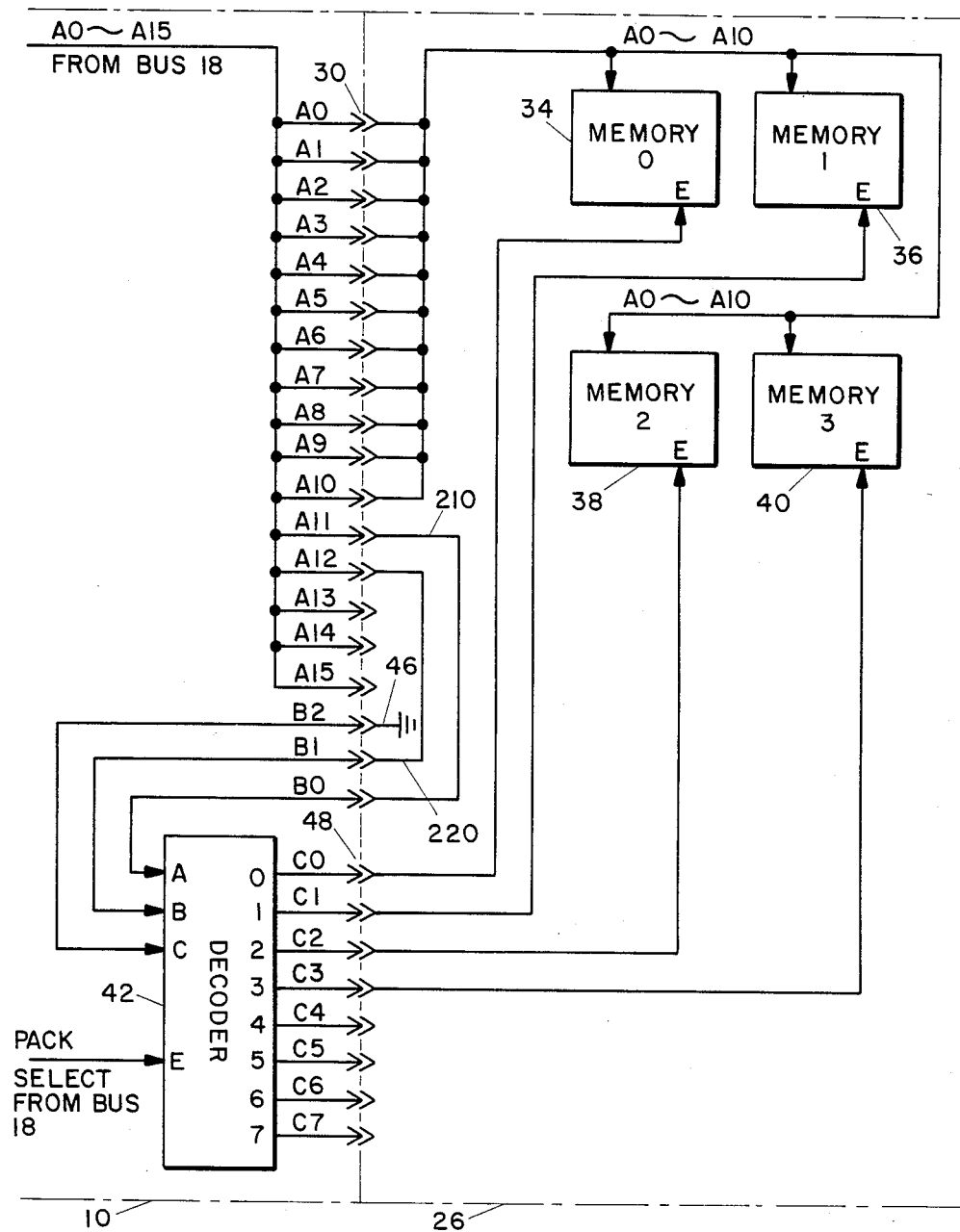
FIG. 2A shows a block diagram of the first embodiment according to the present invention which accepts an 8K-bit (byte) memory pack.

Referring to FIG. 2A, a block diagram of a first embodiment according to the present invention is shown. This drawing shows a part of processor 10 and memory pack 26 relating to the present invention. In processor 10, the sixteen address lines A0 through A15 from main bus 18 are connected to address connector 30 consisting of sixteen contacts, (A0~A15), and the input terminals A, B and C of decoder (chip selector) 42 are connected to feedback connector 46 consisting of three contacts (B0~B1). The enable terminal E of decoder 42 receives the pack select signal via bus 18, and the eight output terminals (0~7) thereof are connected to selection connector 48 consisting of eight contacts (C0~C7). It should be noted that, A0, B0 and C0 are the least significant bits (LSB) and A15, B2 and C7 are the most significant bits (MSB) of their respective data words. Memory pack 26 includes four 2K-bit (byte) memory chips 34 through 40 which may be RAMs or ROMs. Since each memory chip is 2K-bit (byte), eleven address lines are necessary to address each memory chip. The address terminals of memory chips 34 through 40 are coupled to the contacts (A0~A10) of address connector 30, and the enable terminals E thereof are connected to the contacts (C0~C3) of selection connector 48. Memory pack 26 includes four memory chips, so that the address lines A11 and A12 (chip selection signal) are used to provide chip selection signals for selecting one of the memory chips. In a system not including any other memory these signals might be connected directly to terminals A and B of decoder 42. Thus, the signals received via contacts A11 and A12 of address connector 30 are respectively coupled to the contacts B0 (LSB) and B1 of feedback connector 46 in memory pack 26. The contact B2 of feedback connector 46 is grounded in memory pack 26. Since the data lines and the other control lines present in a typical memory have no relation to the present invention, they are not shown in FIG. 2A.

Note that memory pack 26 is attached to processor 10 via connectors 30, 46 and 48. When memory pack 26 is to be accessed, CPU 12 supplies the pack select signal via bus 18 to decoder 42, thereby enabling decoder 42. The address signals (A0~A15) are applied from CPU 12 to address connector 30. Only the address signals A11 and A12 are applied to the input terminals A and B of decoder 42 via address connector 30, signal paths 210 and 220 in memory pack 26, through feedback connector 46 to chip decoder 42. It should be noted that the input signal C (MSB) of decoder 42 is grounded. The address signals A11 and A12 are decoded by decoder 42, and one of the contacts (C0~C3) of selection connector 48 is selected and goes to a logical "High". This "High" level enables one of memory chips 34 through 40. Each memory chip is addressed by the address signals A0 through A10. Since memory pack 26 does not require decoder 42, the number of chips required in memory pack 26 is decreased correspondingly and memory pack 26 can be smaller. Feedback connector 46 includes three contacts and selection connector 48 includes eight contacts, so that memory pack 26 can separately select eight different memory chips. It is important to note that the relationship of chip selection and the address signals is determined in accordance with coupling paths on memory pack 26 which couple the signals between connectors 46 and 48.

Figure 2B:
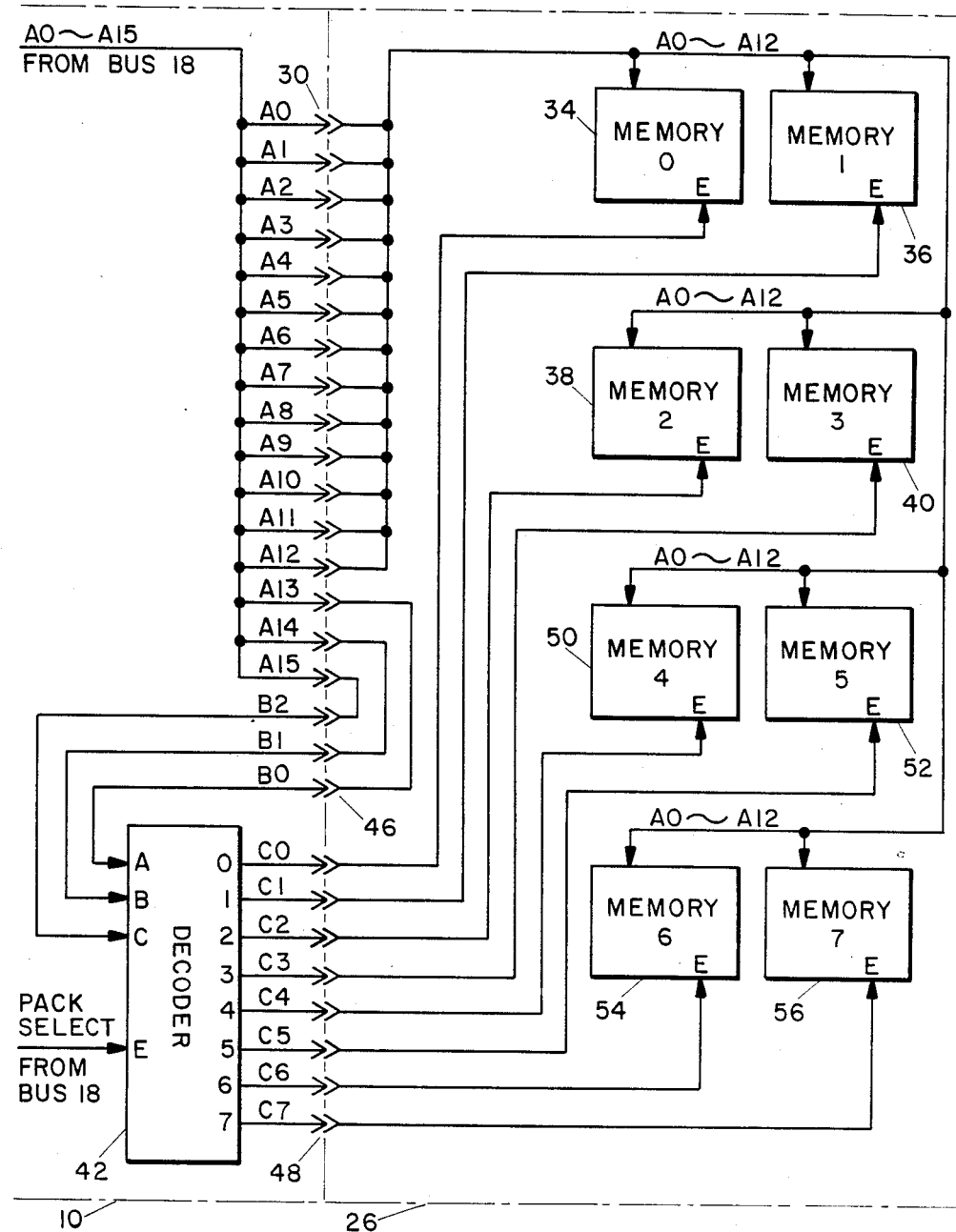
FIG. 2B shows a block diagram of the first embodiment according to the present invention which accepts a 64K-bit (byte) memory pack.

FIG. 2B shows a block diagram of another example of the first embodiment according to the present invention. In this example, memory pack 26 includes eight 8K-bit (byte) memory chips 34 through 40 and 50 through 56. Since the higher three bit address lines (A13~A15) are used as chip selection signals to select the memory chip, the contacts A13, A14 and A15 of address connector 30 are respectively connected to the contacts B0, B1 and B2 of feedback contact 46 in memory pack 26, and the contacts C0 through C7 of selection connector 48 are coupled to the enable terminals E of memory chips 34 through 40 and 50 through 56, respectively. It should be noted that the connection relationships of connectors 30, 36 and 48 and decoder 42 are relatively the same as the case of FIG. 2A. Therefore, in this embodiment, main frame 10 can accept different kinds of memory packs, so long as the number of memory chips in the memory pack is equal to or less than eight.

Figure 3:
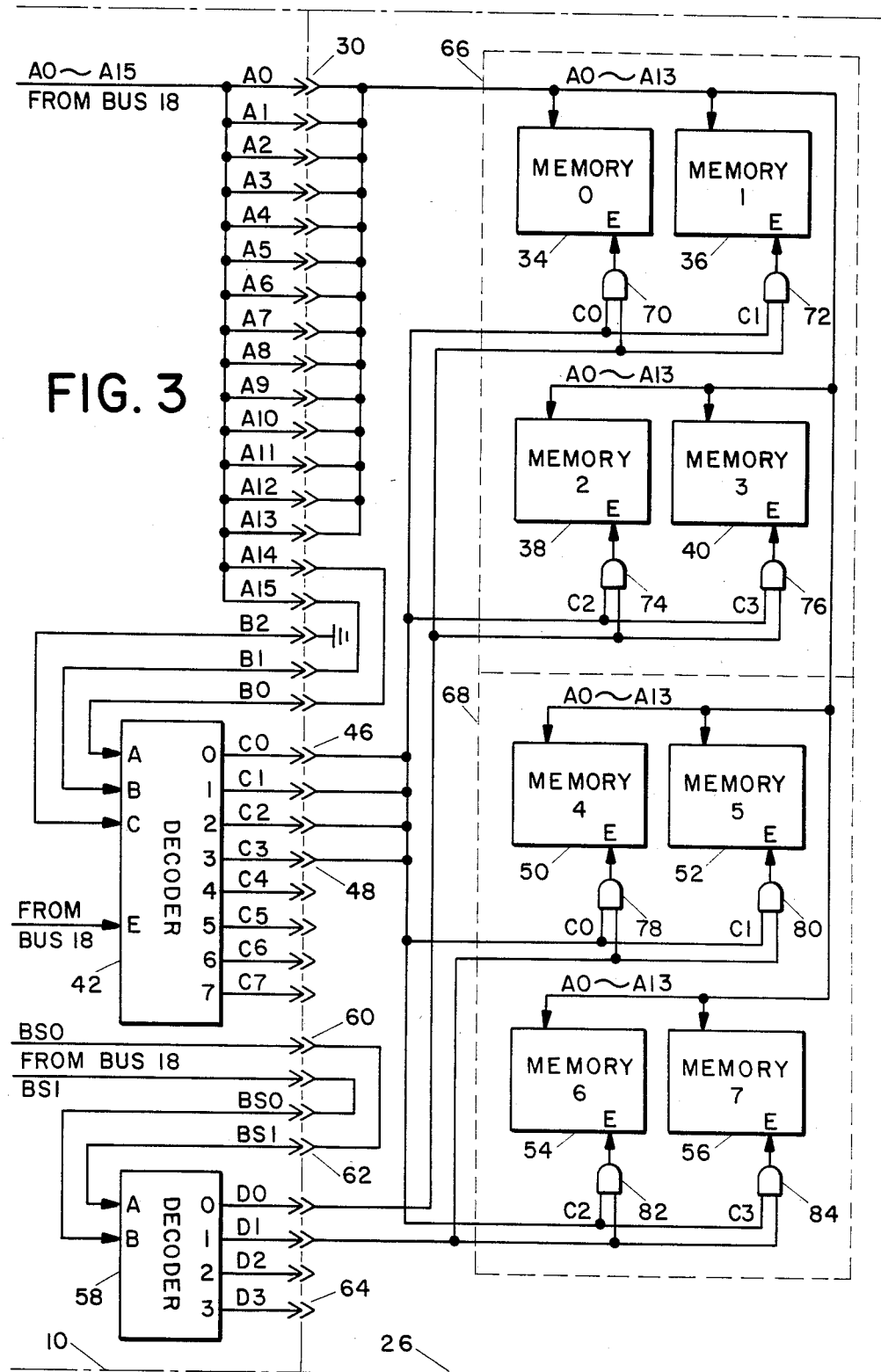
FIG. 3 shows a block diagram of a second embodiment according to the present invention.

The present invention allows a bank switching technique to expand the memory capacity beyond the number determined by the number of address lines. FIG. 3 shows a block diagram of a second embodiment according to the present invention. In processor 10, the relations of connectors 30, 46 and 48 and decoder 42 are the same as the previous embodiments of FIGS. 2A and 2B. Processor 10 further includes second decoder (bank selector) 58 which receives bank selection signals BS0 and BS1 via connector 60, which are coupled by predetermined signal paths in memory pack 26 to connector 62 and then to decoder 58. The decoder outputs from decoder 58 are connected to bank selection connector 64 which has four contacts. Memory pack 26 includes two memory banks 66 and 68 each having four 16K-bit (byte) memory chips and four AND gates. Fourteen address lines (A0~A13) are connected between the contacts A0 through A13 of address connector 30 and the address terminals of each memory chip. The contacts A14 and A15 of address connector 30 are respectively connected to the contacts B0 and B1 of feedback connector 46. If AND gate 70 receives the chip selection signal C0 from decoder 42 and the bank selection signal D0 from decoder 58 it enables memory chip 34. Similarly, AND gates 72 through 76 enable memory chips 36 through 40 in response to the chip selection signals C1 through C3 and the bank selection signal D0. AND gates 78 through 84 enable memory chips 50 through 56 in response to the chip selection signals C0 through C3 and the bank selection signal D1. Note that memory pack 26 can be smaller than otherwise possible because both decoder 42 and 58 are part of processor 10 and are not duplicated in each memory pack. Since connector 64 consists of four contacts, the embodiment of memory pack 26 shown in FIG. 3 can accommodate four selectable memory banks.

As can be discussed from the foregoing, the memory pack addressing system of the present invention decreases the number of chips in the memory packs (allowing the memory pack to be more compact) because circuits such as the memory chip selector or decoder are provided once in processor 10 instead of being in each memory pack. Generally, the processor has enough room to accept these additional chips. The present invention can accept many different types and sizes of memories in the memory packs, because the chip selection signals are controlled by the connecting signal paths provided in the individual memory packs.

In addition, the preferred embodiment of the present invention can be mixed with memory packs of conventional construction. For example, if particular memory pack includes the chip selector, the processor 10 of the present invention can still utilize this memory pack since all necessary connections are still completed. The decoder in the main frame is simply not used for this pack. Thus, the present invention may be used with conventional memory packs, i.e. ones which each supply their own decoders and are directly coupled to all the memory address lines.

It will be obvious to those having ordinary skill in the art that many changes may be made in the above-described details of the preferred embodiments of the present invention. For example, the number of contacts in the address and the other connectors may be any desired number. Also, latch circuits may be provided at the input sides of the chip selector and the bank selector. Moreover, the bank selector may receive the bank selection signals directly from the processor bus. Therefore, the scope of the present invention should be determined only by the following claims.

I claim:

1. An expandable memory pack addressing system for a microprocessor system, comprising:

an address bus provided within said microprocessor system, said address bus having a plurality of parallel-bit address lines coupled to respective first contacts of a memory pack connector;

memory selection means provided within said microprocessor system, said memory selection means having a plurality of input lines coupled to respective second contacts of said memory pack connector and a plurality of memory select output lines coupled to respective third contacts of said memory pack connector; and memory pack means connectable to said memory pack connector, said memory pack means comprising a plurality of selectable memories, a plurality of address lines connected to said memories, a plurality of memory selection lines connected to said memories, and a plurality of feedback signal lines, wherein said address lines are connectable to some, but not all, of said first contacts of said memory pack connector, said feedback signal lines are connectable between predetermined said first contacts and second contacts of said memory pack connector, and said memory selection lines are connectable to said third contacts of said memory pack connector.

2. A system in accordance with claim 1 wherein parallel bits of said parallel-bit address lines are ranked in order from higher order bits to lower order bits, and wherein the higher order bits of said parallel-bit address lines are coupled to said memory selection means via said feedback signal lines in said memory pack means, and said lower order bits of said parallel-bit address lines are coupled to said plurality of selectable memories.

3. A system in accordance with claim 2 wherein the number of feedback signal lines is determined by the number of memories in said memory pack means, and wherein said memory selection means is a binary decoder.

* * * * *